United States Patent [19]
Kai et al.

[11] Patent Number: 5,841,730
[45] Date of Patent: Nov. 24, 1998

[54] SEMICONDUCTOR MEMORY DEVICE HAVING SYNCHRONOUS WRITE DRIVER CIRCUIT

[75] Inventors: Yasuyuki Kai, Yokohama; Katsushi Nagaba, Kawasaki; Shigeo Ohshima, Yokohama, all of Japan

[73] Assignee: Kabushiki Kaisha Toshiba, Tokyo, Japan

[21] Appl. No.: 790,907

[22] Filed: Jan. 29, 1997

[30] Foreign Application Priority Data

Jan. 31, 1996 [JP] Japan ................................. 8-015727

[51] Int. Cl.⁶ ..................................................... G11C 8/00
[52] U.S. Cl. ...................................... 365/233; 365/159.01
[58] Field of Search ................................... 365/233, 149, 365/189.01

[56] References Cited

U.S. PATENT DOCUMENTS

| | | | |
|---|---|---|---|
| 5,091,889 | 2/1992 | Hamano et al. | 365/233.5 |
| 5,539,693 | 7/1996 | Koshikawa et al. | 365/189.05 |
| 5,566,108 | 10/1996 | Kitamura | 365/233 |
| 5,581,512 | 12/1996 | Kitamura | 365/233 |
| 5,592,434 | 1/1997 | Iwamoto et al. | 365/233 |

*Primary Examiner*—David C. Nelms
*Assistant Examiner*—Hoai V. Ho
*Attorney, Agent, or Firm*—Loeb & Loeb LLP

[57] ABSTRACT

A semiconductor memory device capable of shortening data reading time in a first read cycle after the mode has been changed from a write mode to a read mode while maintaining high-speed cycle time when data is written despite simple structure, the semiconductor memory device having a memory cell array having a plurality of dynamic memory cells, to which data can be written, data line pairs to which data read from the memory cells and data which must be written on the memory cells are transferred, a write driver for driving the data line pairs in accordance with write data supplied from outside when data is written to the memory cells and an equalizing circuit for setting the data line pairs to an intermediate potential whenever the data line pairs are operated by the write driver.

15 Claims, 6 Drawing Sheets

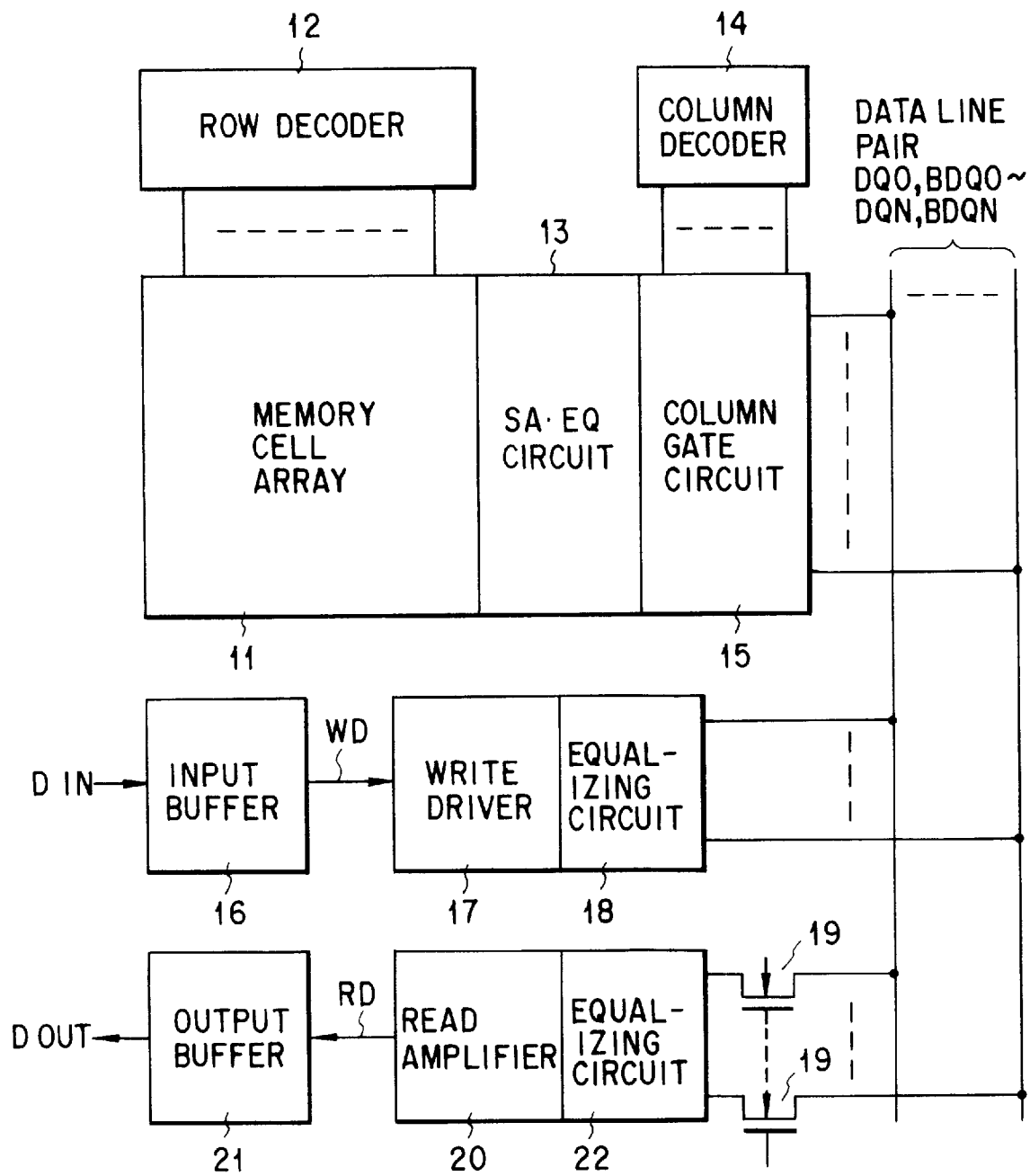
F I G. 1

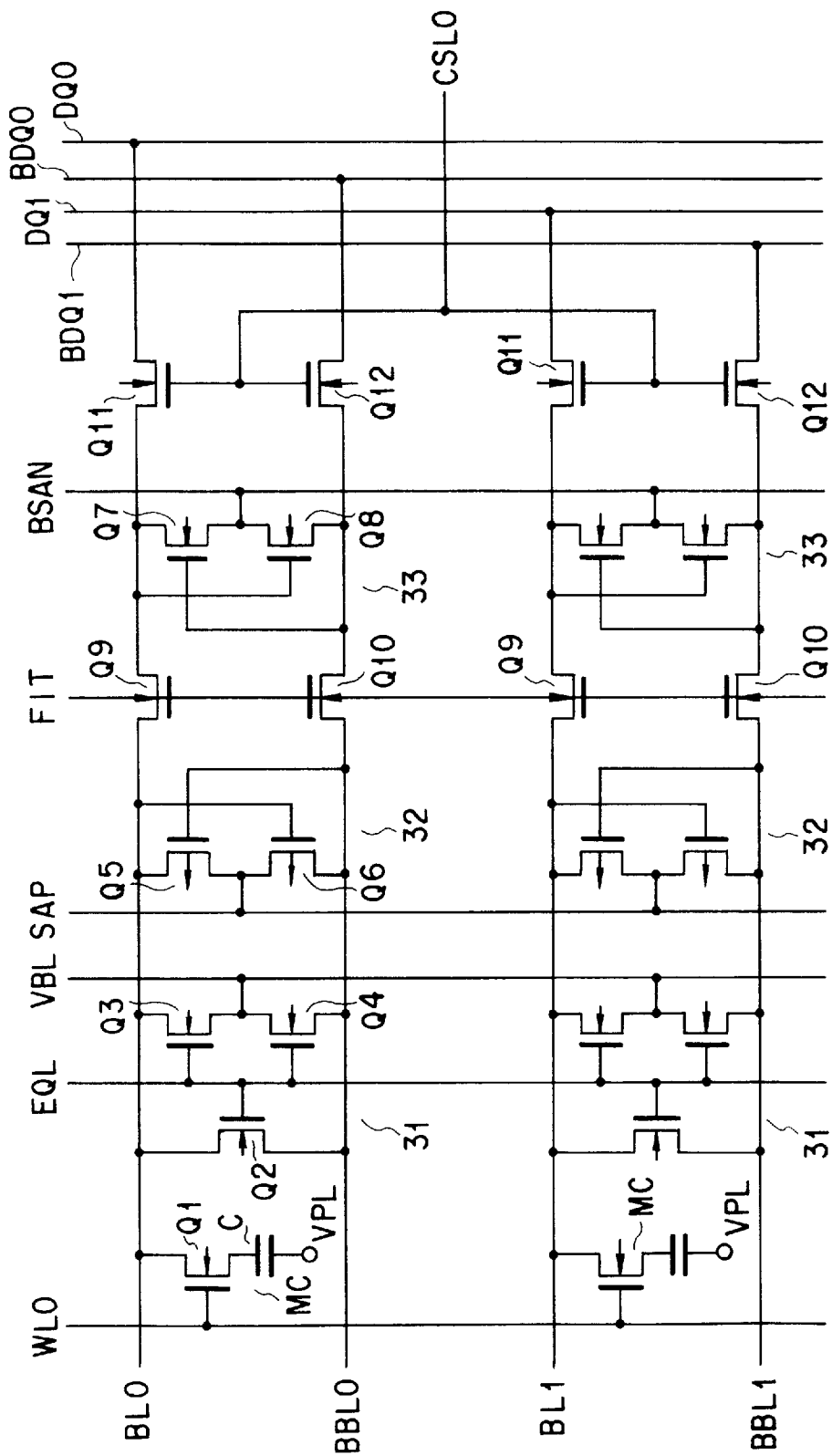
F I G. 2

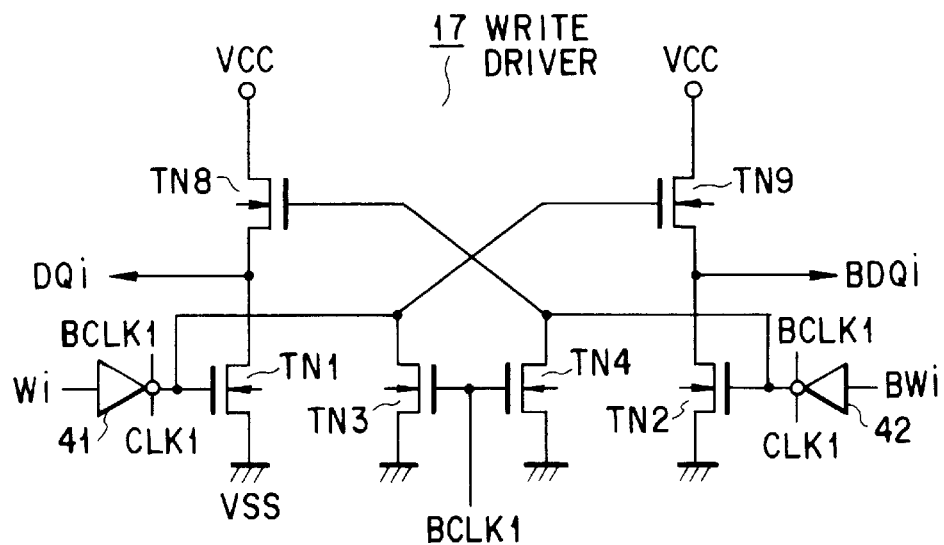
F I G. 5
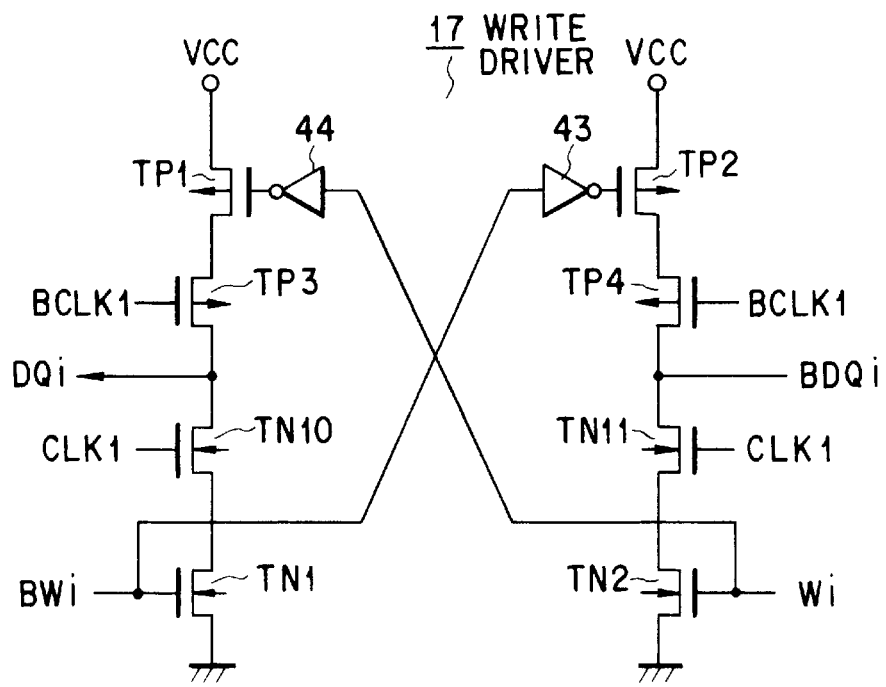
F I G. 6

SEMICONDUCTOR MEMORY DEVICE HAVING SYNCHRONOUS WRITE DRIVER CIRCUIT

BACKGROUND OF THE INVENTION

The present invention relates to a semiconductor memory device for writing and reading data, and more particularly to a semiconductor memory device which is capable of performing a high speed operation.

FIG. 7 is a block diagram showing a schematic structure of a conventional DRAM (Dynamic RAM) for writing and reading data. Data supplied from outside when data is written is supplied to an input buffer 51. An output from the input buffer 51 is, through a write data line WD, supplied to a write driver 52. Complementary output data from the write driver 52 is supplied to a memory cell array 53 through a data line pair DQ and BDQ so that data is written into a selected memory cell in the memory cell array 53.

FIG. 8 is a detailed circuit diagram of the write driver 52 of the conventional DRAM. The write driver 52 is composed of two N-channel MOS transistors (hereinafter called as "NMOS transistors") Q21 and Q22, two P-channel MOS transistors (hereinafter called as "PMOS transistors") Q23 and Q24 and two inverters 61 and 62.

In the above-mentioned structure, when write data is "1", the level of data BWi, which is supplied to the gate of the NMOS transistor Q21 in the write driver 52 through the write data line WD, is lowered to a low (L) level. On the other hand, the level of data Wi, which is supplied to the gate of the NMOS transistor Q22, is raised to a high (H) level. At this time, the PMOS transistor Q23 connected to the data line DQi and the NMOS transistor Q22 connected to the data line BDQi are turned on, causing the data line DQi to be electrically charged to a level of power supply potential Vcc. Thus, the level of the data line DQi is raised to the H level. Moreover, the data line BDQi is electrically discharged to the ground potential Vss so that the level of the data line BDQi is lowered to the L level. As described above, the write driver 52 transmits write data to the data line pair DQi and BDQi.

As described above, write data supplied from outside is temporarily stored in the input buffer 51, and then supplied to the write driver 52 through the write data line WD. Since the write driver 52 is always supplied with data from the input buffer 51 when the data is written, the write driver 52 is always activated. As a result, the data line pair is always set to level "1" or "0". Then, a column in the memory cell array is selected as described above so that data in the data line pair is transferred to the bit line pair of the selected column. Therefore, the structure in which the write driver 52 is always activated attains a great margin in view of the writing operation.

However, the conventional DRAM suffers from the following problems.

(1) In the above-mentioned structure, write data supplied from outside is temporarily stored in the input buffer 51, and then supplied to the write driver 52 through the write data line WD. The write driver 52 is always activated because it is always supplied with data from the input buffer 51 so that the data line pair is always set to "1" or "0". Therefore, when the level mode of write data is switched from "0" to "1" or from "1" to "0", the potential of the data line pair is fully swung from the ground potential Vss to the power supply potential Vcc or from the power supply potential Vcc to the ground potential Vss. Therefore, a long time is required to switch the potential of the data line pair. The foregoing fact does not raise a critical problem with the conventional DRAM in which writing is performed asynchronously. However, there arises a critical problem with a clock synchronous DRAM, which is capable of writing and reading data at high speed, when it performs burst write. In particular, the cycle time rate cannot be raised.

(2) Since the equalizing operation of the data line pair is not performed in the write cycle when the write mode has been switched to the read mode, the data line pair is first equalized when the read cycle starts. Then, reading is performed. Therefore, there arises a problem in that an excessively long time is required to first read data after the mode has been switched to the read mode.

The operation at this time will now be described with reference to a time chart shown in FIG. 9. FIG. 9 is a time chart of an operation in a mode of CAS latency=3 (a mode in which data is read after three clocks from the supply of a read command) which is one of operation modes of a synchronous DRAM. Final write data Din (3) in the write cycle is, in the cycle in which the read command has been supplied, transferred to the data line pair as DQ (3). First read data Read (0) in the read cycle is transferred to the data line pair at the cycle next to the foregoing cycle in which the read command has been transferred. Prior to transferring read data to the data line pair, the operation for equalizing the data line pair is performed so that both of the data lines of the data line pair are set to an intermediate potential (for example Vcc/2). However, since the potential of the data line pair is fully swung between Vcc and Vss when data is written in the cycle immediately before the foregoing cycle, an excessively long time takes to perform the operation for equalizing the data line pair before data is read and thus initial reading of data is delayed excessively. If the cycle time is elongated or the level of the power supply potential Vcc is raised, reading of data is furthermore delayed. Referring to FIG. 9, CLK represents a clock signal supplied from outside, CLK1 represents internal clock signal generated in the DRAM in response to the external clock signal, and CSL (1) to CSL (3) represent signals for selecting columns in the memory cell array.

To prevent the delay of the reading operation, it might be considered feasible to employ a structure in which an equalizing pulse is generated when switch of the mode from the write mode to the read mode has been detected to advance the equalizing operation start timing by using the generated pulse. However, the above-mentioned method has a problem in that the write margin of the final write cycle can be reduced. Furthermore, complicated control must be performed.

Although the above-mentioned problems (1) and (2) can individually be solved, individual solution adversely affects the other circuit portions or complicated control must be performed.

BRIEF SUMMARY OF THE INVENTION

In view of the foregoing, an object of the present invention is to provide a semiconductor memory device which is capable of shortening data reading time in a first read cycle after the mode has been changed from a write mode to a read mode while maintaining high-speed cycle time when data is written despite simple structure.

According to an aspect of the present invention, there is provided a semiconductor memory device comprising: a memory cell array having a plurality of memory cells to which data can be written; data lines to which data read from the memory cells and data to be written on the memory cells are transferred; a write driver circuit for driving the data lines in accordance with write data supplied from outside when data is written to the memory cells; and an equalizing circuit for setting the data lines to predetermined potentials whenever the data lines are operated by the write driver circuit.

According to another aspect of the present invention, there is provided a semiconductor memory device comprising: a memory cell array having a plurality of memory cells to which data can be written; data lines to which data read from the memory cells and data to be written on the memory cells are transferred; a write driver circuit, the operation of which is controlled in response to a synchronizing signal supplied from outside and which drives the data lines in accordance with write data supplied from the outside; and an equalizing circuit, the operation of which is controlled in response to the synchronizing signal and arranged to set the data lines to predetermined potentials whenever the data lines are driven by the write driver circuit.

According to a further aspect of the present invention, there is provided a semiconductor memory device comprising: a memory cell array having a structure in which a plurality of dynamic memory cells are disposed in a matrix configuration; bit lines to each of which a plurality of memory cells disposed in one line are commonly connected in the memory cell array; data lines connected to the bit lines through a column selection switch; an amplifying circuit for reading data connected to the data lines and arranged to amplify the potentials of the data lines; a first equalizing circuit arranged to be operated in a read mode in which data is read from the memory cells to set the data lines to a predetermined potential prior to reading data from the memory cells; a write driver circuit connected to the data lines and arranged to drive the data lines in accordance with write data supplied from outside; and a second equalizing circuit arranged to be operated in a write mode in which data is written to the memory cells to set the data lines to a predetermined potential whenever the data lines are operated by the write driver circuit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a block diagram schematically showing the structure of a synchronous DRAM according to an embodiment of the present invention;

FIG. 2 is a circuit diagram showing structures of a memory cell array 11, a SA·EQ circuit 13, a column gate circuit 15 and data line pairs DQ0, BDQ0 and DQ1, BDQ1 in the DRAM shown in FIG. 1;

FIG. 5 is a circuit diagram showing another structure of the write driver 17 in the DRAM shown in FIG. 1;

FIG. 6 is a circuit diagram showing a further structure of the write driver 17 in the DRAM shown in FIG. 1;

DETAILED DESCRIPTION OF THE INVENTION

Figure 3:
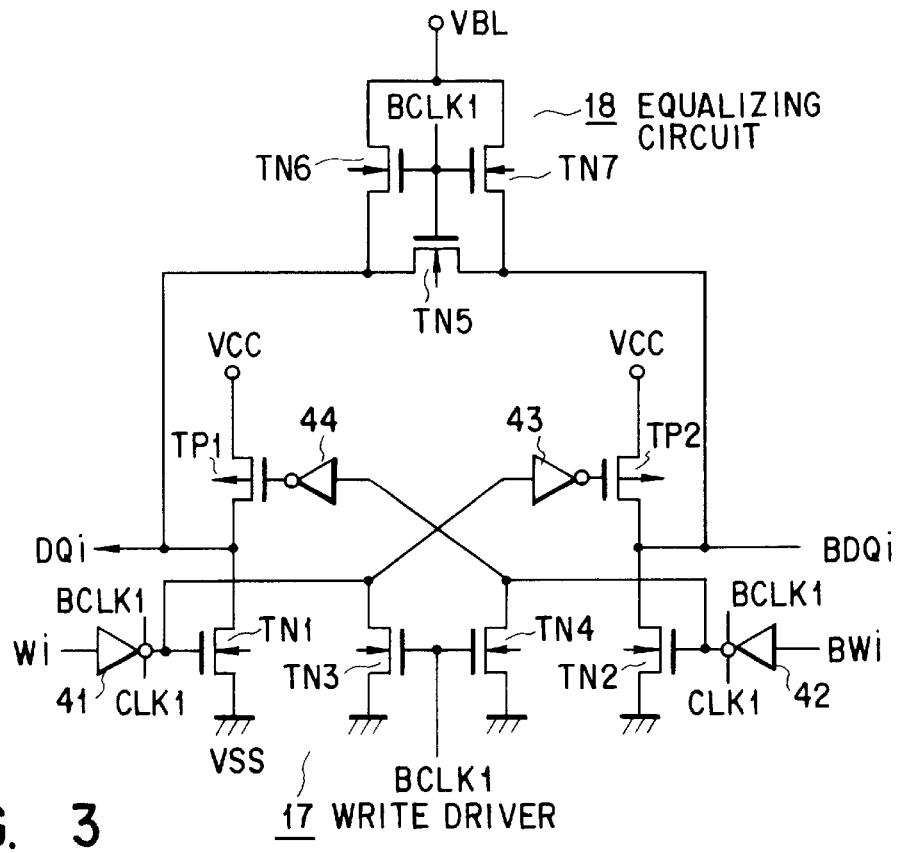
FIG. 3 is a circuit diagram showing the structures of portions of a write driver 17 and an equalizing (EQ) circuit 18 of the DRAM shown in FIG. 1 respectively relating to one data line pair.

Referring to the drawings, an embodiment of the present invention will now be described.

Figure 10:
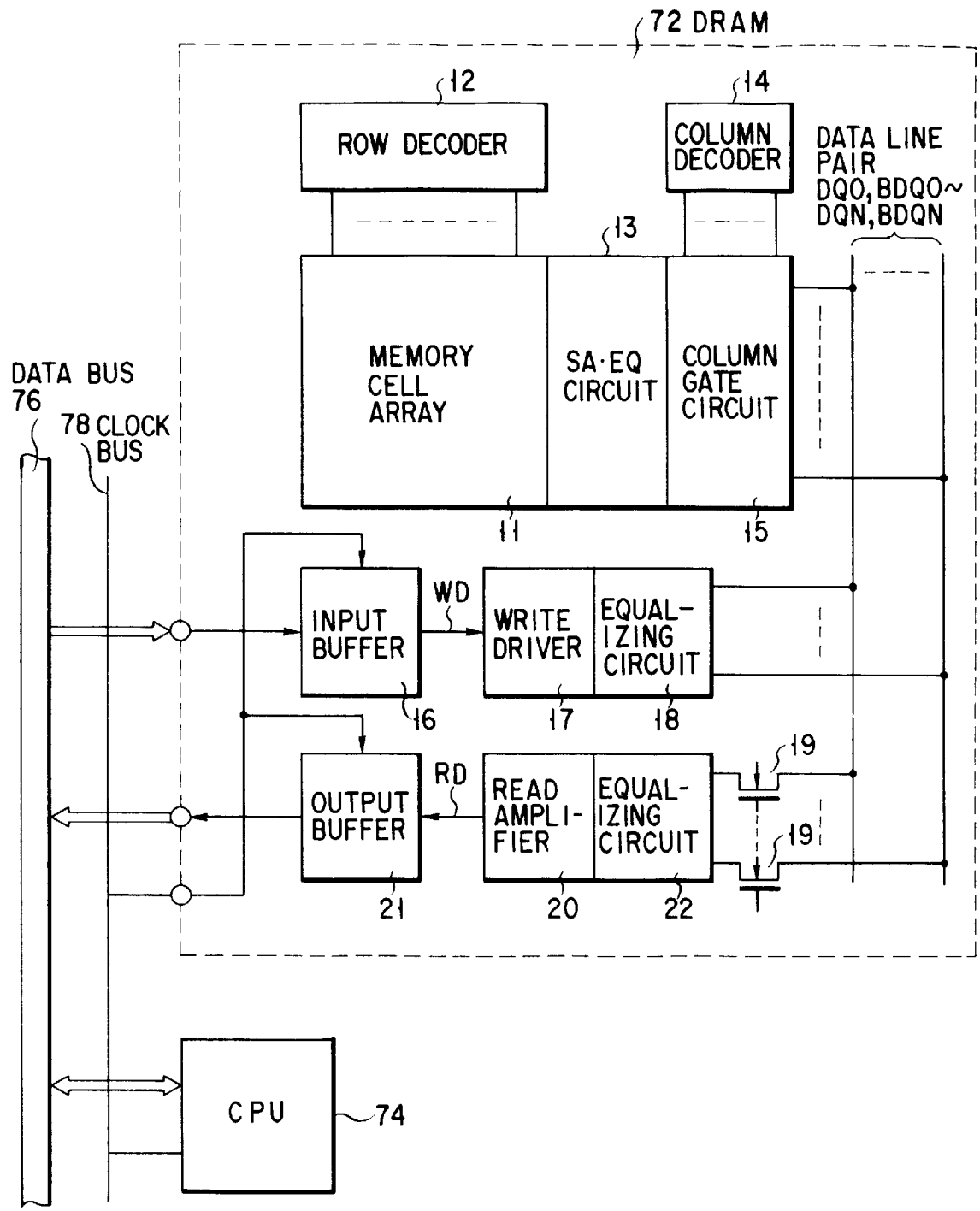
FIG. 10 is a block diagram of the synchronous DRAM shown in FIG. 1 and CPU.

FIG. 1 is a block diagram schematically showing the overall structure of the embodiment in which a semiconductor memory device according to the present invention is applied to a synchronous DRAM. FIG. 10 is a block diagram of the synchronous DRAM 72 shown in FIG. 1 (encircled by broken line in FIG. 10) and CPU 74. DRAM 72 and CPU 74 are connected to data bus 76 and clock bus 78. The timing of input data and output data are controlled by clock signals issued by CPU 74, and transmitted via data bus 76 between DRAM 72 and CPU 74. Referring to FIGS. 1 and 10, reference numeral 11 represents a memory cell array. The memory cell array 11 includes a plurality of dynamic memory cells disposed in a matrix configuration, as shown in FIG. 2. The memory cell array 11, as shown in FIG. 2, includes a plurality of bit line pairs BL0 and BBL0, BL1 and BBL1, . . . , and a plurality of word lines (FIG. 2 shows only one typical word line WL0). The plural word lines are selectively operated by a row decoder 12. The plural bit line pairs are connected to a bit-line-potential sense amplifier precharge/equalizing circuit (hereinafter called as a "SAΩEQ circuit") 13. The SAΩEQ circuit 13, as described later, has a plurality of bit-line-potential sense amplifiers and precharge/equalizing circuits to correspond to the plural bit line pairs. The above-mentioned circuits respectively perform the bit-line-potential sensing operations and the precharge/equalizing operations. The plural bit line pairs are selectively connected to a plurality of data line pairs DQ0, BDQ0 to DQN, BDQN through a column gate circuit 15 to which an output from a column decoder 14 is supplied.

In the data write mode, write data Din supplied from outside is supplied to an input buffer 16. An output from the input buffer 16 is, through a write data line WD, supplied to a write driver 17. A complementary output data from the write driver 17 is transferred to the data line pairs DQ0, BDQ0 to DQN, BDQN. Moreover, an equalizing (EQ) circuit 18 for equalizing the potential of the plural bit line pairs in synchronization with the internal clock signal in the data write mode is connected to the data line pairs DQ0, BDQ0 to DQN, BDQN.

In the data read mode, data, read from the memory cell and transferred to the data line pairs DQ0, BDQ0 to DQN, BDQN through the bit line pairs and the column gate circuit 15, is supplied to a read amplifier 20 through switches 19 which are selectively switched on. Data amplified by the read amplifier 20 is, through a read data line RD, supplied to an output buffer 21 so as to be transmitted as read out data Dout from the output buffer 21. An equalizing (EQ) circuit 22 is connected to the read amplifier 20. The equalizing circuit 22 is arranged to perform an operation for equalizing the potentials of the plurality bit line pairs when the mode is the data read mode.

FIG. 2 is a circuit diagram showing the memory cell array 11, the SAΩEQ circuit 13, the column gate circuit 15 and the data line pairs shown in FIG. 1. To simplify the illustration, FIG. 2 shows only the structure relating to the memory cell arrays 11 for two columns and two data line pairs. A plurality of dynamic memory cells MC are connected to each of the two pairs of bit line pairs BL0, BBL0 and BL1, BBL1 in the memory cell array 11 (see FIG. 1). Only two typical dynamic memory cells MC are illustrated to simplify the description. Each of the memory cells MC comprises a data storage capacitor C and an NMOS transistor Q1 for selecting a memory cell. The source or the drain of the NMOS transistor Q1 is connected to the corresponding bit line, while the gate is connected to one of the plural word lines (FIG. 2 shows only the word line WL0). Capacitor plate potential VPL is commonly supplied to each end of all of the capacitor C for storing data.

Reference numeral 31 represents a precharge/equalizing circuit in the SAΩEQ circuit 13 shown in FIG. 1. The precharge/equalizing circuit 31 comprises three NMOS transistors Q2 to Q4. An electric current path between the source and the drain of the NMOS transistor Q2 is connected between bit lines of each of the bit line pairs. An electric current path between the source and the drain of the NMOS transistor Q3 is connected between either (BL0 and BL1) of the bit lines of each of the bit line pairs and the node of the bit line precharge potential VBL (the level of VBL is between Vcc and Vss and is usually set to Vcc/2). An electric current path between the source and the drain of the NMOS transistor Q4 is connected between the other bit line (BBL0 and BBL1) of the each of the bit line pairs and the node of the bit line precharge potential VBL. Equalizing signals EQL are supplied to the gate of the three NMOS transistors Q2 to Q4.

The sense amplifier in the SAΩEQ circuit 13 shown in FIG. 1 comprises a P-channel side sense amplifier 32 and an N-channel side sense amplifier 33. Moreover, the P-channel side sense amplifier 32 comprises two PMOS transistors Q5 and Q6, while the N-channel side sense amplifier 33 comprises two NMOS transistors Q7 and Q8. An electric current path between the source and the drain of the PMOS transistor Q5 is connected between either (BL0 and BL1) of the bit lines of each of the bit line pairs and the node of a sense enable signal SAP for the P-channel side sense amplifier. An electric current path between the source and the drain of the PMOS transistor Q6 is connected between the other bit line (BBL0 and BBL1) of each of the bit line pairs and the node of the sense enable signal SAP. Each gate of the PMOS transistors Q5 and Q6 is connected to the other bit line of each of the bit line pairs. Similarly, an electric current path between the source and drain of the NMOS transistor Q7 is connected between either (BL0 and BL1) of the bit lines of each of the bit line pairs and the node of the sense enable signal BSAN for the N-channel side sense amplifier. An electric current path between the source and the drain of the NMOS transistor Q8 is connected between the bit line (BBL0 and BBL1) of each of the bit line pairs and the node of the sense enable signal BSAN. Each gate of the NMOS transistors Q7 and Q8 is connected to the other bit lines of each of the bit line pairs.

Bit line transfer gates Q9 and Q10 each comprising an NMOS transistor are, between the P-channel side sense amplifier 32 and the N-channel side sense amplifier 33, respectively inserted into either of the bit lines and the other bit line of the bit line pair. A bit line transfer gate control signal FIT is supplied to the gate of each of the two transfer gates Q9 and Q10.

Each column of the column gate circuit 15 is provided with two NMOS transistors Q11 and Q12. An end of each of the two NMOS transistors Q11 and Q12 provided for each column is connected to the corresponding bit line pair through the bit line transfer gates Q9 and Q10. Each of the other ends of the bit line transfer gates Q11 and Q12 on the bit line pairs BL0 and BBL0 is connected to the data line pairs DQ0 and BDQ0. Each of the other ends of the bit line transfer gates Q11 and Q12 on the bit line pairs BL1 and BBL1 respectively are connected to the data line pairs DQ1 and BDQ1. Each gate of the NMOS transistors Q11 and Q12 of each column is supplied with column selection signal CSL0 transmitted from the column decoder 14.

When data is, in the data write mode, written to the DRAM having the foregoing structure, write data Din supplied from outside is supplied to the input buffer 16. An output from the input buffer 16 is, through the write data line WD, supplied to the write driver 17. Moreover, an output from the write driver 17 is transferred to the data line pair. Then, a column is selected in response to the column selection signal corresponding to the column address. The two NMOS transistors Q11 and Q12 in the column gate circuit 15 of the selected column are turned on. If the column selection signal is, for example, CLS0, the NMOS transistors Q11 and Q12 of the two columns shown in FIG. 2 are turned on so that data is transferred from the data line pairs DQ0, BDQ0 and DQ1, BDQ1 to the bit line pairs DQ0, BDQ0 and DQ1, BDQ1. Moreover, one word line (for example, WL0) corresponding to the row address is selected in response to the word line selection signal, thus causing the NMOS transistor Q1 in the memory cell MC connected to the selected word line to be turned on. Thus, data is written to the memory cell MC from the bit line through the NMOS transistor Q1, which has been turned on as described above.

The operation of reading data is performed in the data read mode such that three NMOS transistors Q2 to Q4 in each of the precharge/equalizing circuits 31 are turned on in response to the equalizing signal EQL so that the potential of the bit lines of each of the bit line pairs is set to the bit-line precharge potential VBL. Then, a word line (for example, WL0) corresponding to the row address is selected so that the NMOS transistor Q1 in the memory cell MC connected to the selected word line is turned on. Thus, the potential corresponding to data stored in the capacitor C of the memory cell MC is read onto the bit line of the bit line pair through the NMOS transistor Q1 which has been turned on. Moreover, the p-channel side and n-channel side sense amplifiers 32 and 33 respectively are activated in response to the sense enable signals SAP and BSAN so that the potential difference between the bit line pairs is amplified by the foregoing sense amplifiers 32 and 33. In response to the column selection signal corresponding to the column address, a column is selected. Thus, two NMOS transistors Q11 and Q12 in each of the column gate circuits 15 in the selected column are turned on. Data of the bit line pair is transferred to the data line pair through the NMOS transistors Q11 and Q12 which have been turned on. Data transferred to the data line pair is, through the switch 19 which is switched on only in the read mode, supplied to the read amplifier 20. Then, data amplified by the read amplifier 20 is supplied to the output buffer 21 through the read data line RD so that data is transmitted from the output buffer 21 as read data Dout. Note that the equalizing circuit 22 performs the operation of equalizing the potential of the data line pair when the mode has been changed from the data write mode to the data read mode.

FIG. 3 is a circuit diagram showing a portion relating to one data line pair (DQ1 and BDQ1) of each of the write driver 17 and the equalizing circuit 18 shown in FIG. 1. The write driver 17 is provided with two CMOS clocked inverters 41 and 42, two inverters 43 and 44, four NMOS transistors TN1 to TN4 and two PMOS transistors TP1 and TP2.

The two clocked inverters 41 and 42 are supplied with internal clock signals CLK1 and BCLK1. Each of the clocked inverters 41 and 42 performs the input inversion operation when the level of the internal clock signal CLK1 is high and the level of the internal clock signal BCLK1 is low. The clocked inverter 41 inverts and transmits data Wi supplied through the write data line WD) (FIG. 1), while the other clocked inverter 42 inverts and transmits data BW1 supplied through the write data line W1) (FIG. 1). Input terminal of the two inverters 43 and 44 respectively are connected to output terminals of the clocked inverters 42 and 41.

An electric current path between the source and drain of the NMOS transistor TN1 is connected between data line DQ1 of the data line pair and the node of the ground potential Vss, while the gate is connected to an output terminal of the clocked inverter 41. An electric current path between the source and the drain of the PMOS transistor TP1 is connected between the node of the power supply potential Vcc and the data line DQi, while the gate is connected to an output terminal of the inverter 44. An electric current path between the source and the drain of the NMOS transistor TN2 is connected between the data line BDQ1 of the data line pair and the node of the ground potential Vss, while the gate is connected to an output terminal of the clocked inverter 42. An electric current path between the source and the drain of the PMOS transistor TP2 is connected between the node of the power supply potential Vcc and the data line BDQ1, while the gate is connected to an output terminal of the inverter 43. An electric current path between the source and the drain of the NMOS transistor TN3 is connected between an output terminal of the clocked inverter 41 and the node of the ground potential Vss. An electric current path between the source and the drain of the NMOS transistor TN4 is connected between an output terminal of the clocked inverter 42 and the node of the ground potential Vss. An internal clock signal BCLK1 is supplied to the gate of each of the above-mentioned two transistors.

The equalizing circuit 18 is provided with three NMOS transistors TN5 to TN7. An electric current path between the source and the drain of the NMOS transistor TN5 is connected between the two data lines DQi and BDQi, an electric current path between the source and the drain of the NMOS transistor TN6 is connected between the data line DQi and the node of the bit line precharge potential VBL, and an electric current path between the source and the drain of the NMOS transistor TN7 is connected between the data line BDQi and the bit line precharge potential VBL. Internal clock signal BCLK1 is supplied to the gate of each of the three NMOS transistors TN5 to TN7.

The operations of the write driver 17 and the equalizing circuit 18 are controlled in synchronization with the internal clock signals CLK1 and BCLK1. The internal clock signals CLK1 and BCLK1 have complementary level relationship so as to generate the external clock signals CLK and BCLK supplied from outside by using a delay circuit means or the like.

Figure 4:
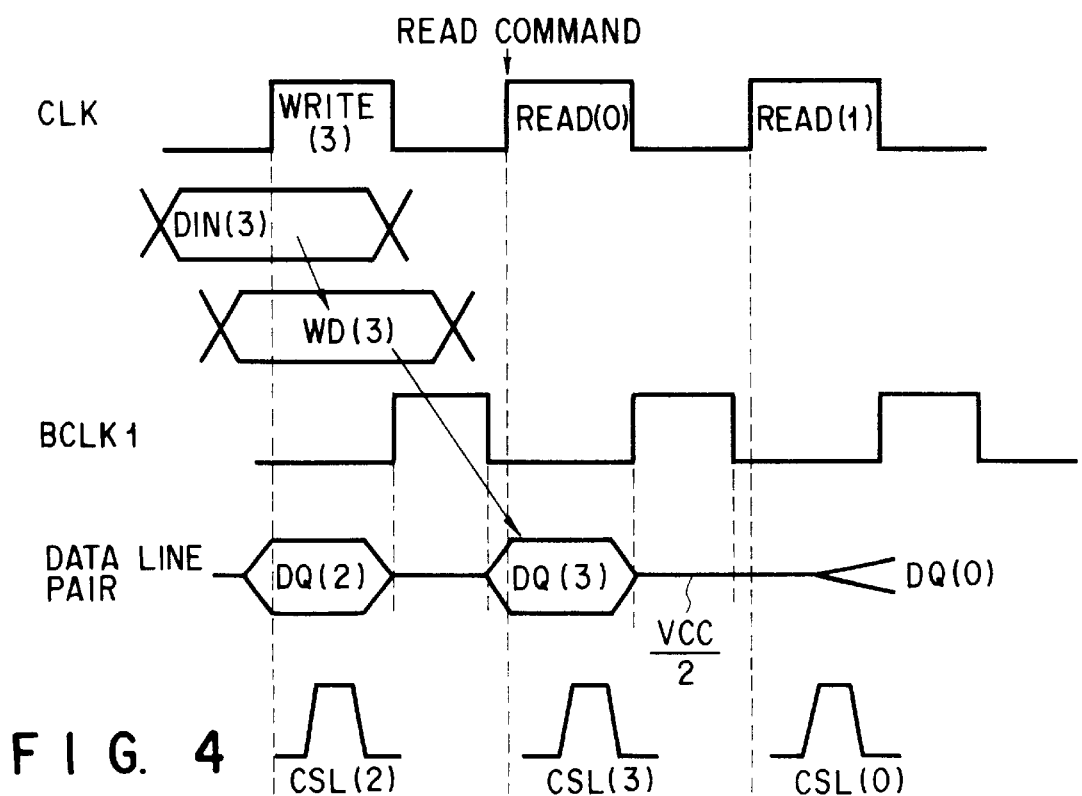
FIG. 4 is a time chart showing the operation of the DRAM shown in FIG. 1.
Figure 7:
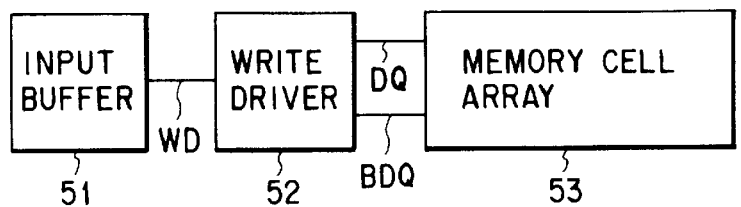
FIG. 7 is a block diagram showing the schematic structure of a conventional DRAM.
Figure 8:
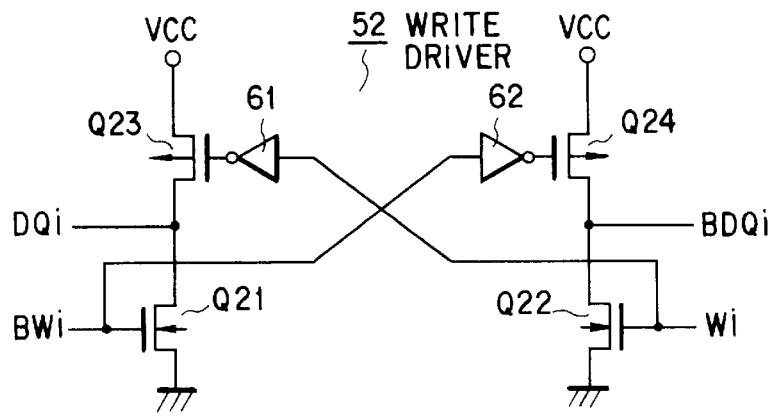
FIG. 8 is a circuit diagram showing a write driver 52 of the conventional DRAM.
Figure 9:
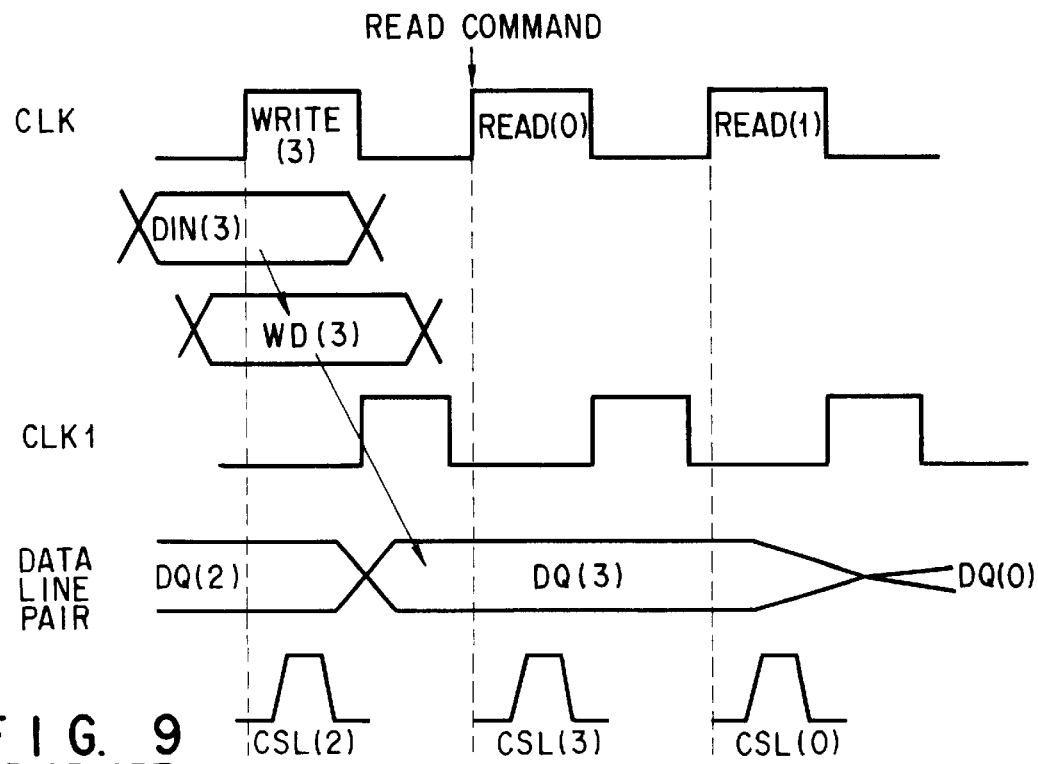
FIG. 9 is a time chart showing the operation of the conventional DRAM.

The operation of the DRAM having the above-mentioned structure will now be described with reference to a time chart shown in FIG. 4, the operation being performed when the mode is switched from the data write mode to the data read mode. FIG. 4 is a time chart of the operation when CAS latency=3 similarly to FIG. 9.

Final write data Din (3) of the write cycle supplied from outside is supplied to the input buffer 16. Output WD (3) from the input buffer 16 is supplied to the write driver 17 through the corresponding write data line WD. In the first half of the write cycle in which data Din (3) is written, the level of the internal clock signal CLK 1 is raised to the high level "H" and that of the internal clock signal BCLK1 is lowered to the low level "L". In the above-mentioned period, the clocked inverters 41 and 42 in the write driver 17 are operated so that write data from the write data line WD is inverted and transmitted. Since the level of BCLK1 is the low level "L", both of the NMOS transistors TN3 and TN4 in the write driver 17 are turned off. Assuming that data (W3) corresponding to Wi shown in FIG. 3 is "1" and data (BW3) corresponding to BWi is "0", the NMOS transistor TN1 and the PMOS transistor TP2 in the write driver 17 are turned on. On the other hand, the NMOS transistor TN2 and the PMOS transistor TP1 are turned off. Therefore, the data line DQ3 of the data line pair DQ3 and BDQ3 is set to "0", while the other data line BDQ3 is set to "1". Thus, an output from the write driver 17 is transferred to the data line pair.

Then, a column is selected in response to the column selection signal (CSL (3) in this case) corresponding to the column address so that two corresponding NMOS transistors Q11 and Q12 in the column gate circuit 15 are turned on. As a result, data Din (3) is transferred to the data line pair as DQ (3) in the cycle in which a read command is supplied. When a word line corresponding to the row address is selected, the NMOS transistor Q11 in the memory cell MC connected to the selected word line is turned on. As a result, data is written on the memory cell MC from the bit line pair through the NMOS transistor Q1 which has been turned on.

In the latter half of the write cycle in which data Din (3) is written, the level of the internal clock signal CLK1 is lowered to "L" and that of the internal clock signal BCLK1 is raised to "H". Since the clocked inverters 41 and 42 in the write driver 17 are deactivated and the level of BCLK1 is high in the above-mentioned period, both of the NMOS transistors TN3 and TN4 in the write driver 17 are turned on. At this time, the level of the gate node of each of the NMOS transistors TN1 and TN2 is lowered to "L". Moreover, the level of the gate node of each of the PMOS transistors TP1 and TP2 is raised to "H". As a result, all of the NMOS transistors TN1 and TN2 and the PMOS transistors TP1 and TP2 are turned off. Therefore, the pair of output nodes (DQ3 and BDQ3) of the write driver 17 are brought to a floating state.

When the level of the internal clock signal BCLK1 is high level "H", all of the three NMOS transistors TN5 to TN7 in the equalizing circuit 18 are turned on. The equalizing circuit 18 sets each of the data line pair DQi and BDQi (DQ3 and BDQ3) to the bit line precharge potential VBL having the value of Vcc/2.

After data has been transferred from the write driver 17 to the data line pair as described above, the potential of the data line pair is set to the intermediate potential (Vcc/2) by the equalizing circuit 18. Therefore, the potential of the data line pair is not fully swung even in a case where data having a level opposite to the previous level is transferred to the data line pair. As a result, the time required to switch the potential of the data line pair when data is written can be shortened. Thus, a satisfactory effect can be obtained in raising the cycle time rate when a synchronous DRAM capable of writing and reading data at high speed performs burst write. A further satisfactory effect can be obtained if the cycle time is elongated or the power supply potential is raised.

Then, first read data Read (0) in the read cycle is transferred to the data line pair in a cycle next to the cycle in which the read command has been supplied. As described above, the equalizing circuit 22 performs the equalizing operation of the corresponding data line pairs before read data is transferred to the data line pair. After final write data Din (3) in the previous write cycle has been supplied, the equalizing circuit 18 sets each of the data line pairs to the bit line precharge potential VBL having the value of Vcc/2. Therefore, the time to equalize the data line pairs by the equalizing circuit 22 before data is read can significantly be shortened as compared with the conventional structure. As a result, first reading of data when the mode has been switched from the write cycle to the read cycle can be performed presently as compared with the conventional structure.

In a period in which the internal clock signal CLK is "L" and BCLK1 is "H", all of the NMOS transistors TN1 and TN2 and the PMOS transistors TP1 and TP2 in the write driver 17 are turned off. Therefore, only the leak current is consumed in the write driver 17 and, therefore, the quantity of electric currents required to be consumed by the write driver 17 can be reduced.

FIGS. 5 and 6 respectively show other structures of the write driver 17. Similarly to the structure shown in FIG. 3, only the circuit structure of a portion relating to one data line pair is illustrated.

The write driver 17 shown in FIG. 5 is different from that shown in FIG. 3 in that NMOS transistors TN8 and TN9 are employed in place of the PMOS transistors TP1 and TP2, the two inverters 43 and 44 are therefore omitted, and the connection of the gates of the NMOS transistors TN8 and TN9 is arranged so that the gates are connected to the output terminals of the clocked inverters 41 and 42.

Since the write driver having the above-mentioned structure is able to omit two inverters from the structure shown in FIG. 3, the size of the chip can be reduced when an integrated circuit structure is formed.

The write driver 17 shown in FIG. 6 is different from that shown in FIG. 3 in that the clocked inverters 41 and 42 are omitted; data Wi and BWi, which are supplied to the gates of the NMOS transistors TN1 and TN2, are therefore inverted; the PMOS transistor TP3 is inserted between the data line DQi and the PMOS transistor TP1; a NMOS transistor TP10 is inserted between the data line DQi and the NMOS transistor TN1; the PMOS transistor TP4 is inserted between the data line BDQi and the PMOS transistor TP2; and a NMOS transistor TP11 is inserted between the data line BDQi and the NMOS transistor TN2. Moreover, the internal clock signal BCLKL is supplied to the gate of each of the PMOS transistors TP3 and TP4; and the internal clock signal CLK1 is supplied to the gate of each of the NMOS transistors TN10 and TN11.

Since the write driver having the above-mentioned structure is able to reduce the number of transistors as compared with the structure shown in FIG. 3, the size of the chip can be reduced when an integrated circuit is formed.

In the write driver having the structure shown in FIG. 6, when the internal clock signal CLK1 is "H" and BCLK1 is "L", the PMOS transistors TP3 and TP4 and the NMOS transistors TN10 and TN11 are turned on so that data of the data line pairs DQi and BDQi are set to correspond to data Wi and BWi. When the internal clock signal CLK1 is "L" and BCLK1 is "H", the PMOS transistors TP3 and TP4 and the NMOS transistors TN10 and TN11 are turned off so that the data line pairs DQi and BDQi are brought to the floating state.

Although the illustration is omitted in FIGS. 5 and 6, the equalizing circuit 18 similar to that shown in FIG. 3 is provided in addition to the write driver. As a matter of course, the data line pair is set to the above-mentioned intermediate potential by the equalizing circuit 18 in the period in which the data line pairs DQi and BDQi are in the floating state by the write driver.

As described above, the semiconductor memory device according to the present invention having a simple structure is able to shorten the data read time in the first read cycle after the mode has been switched from the write mode to the read mode in a state where the high speed cycle time rate in the write mode is maintained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A semiconductor memory device, comprising:

a memory cell array having a plurality of memory cells to which data can be written:

data lines to which data read from said memory cells and data to be written on said memory cells are transferred, said data lines comprising data line pairs for transferring complementary data;

a write driver circuit for driving said data lines in accordance with write data supplied from outside when data is written to said memory cells; and an equalizing circuit for setting said data lines to predetermined potentials whenever said data lines are operated by said write driver circuit, wherein said write driver circuit comprises:

a first signal inversion circuit having an input terminal connected to a node of first internal write data, a logical level of which is the same or opposite to a level of write data supplied from outside, and arranged to be operated when a level of a synchronizing signal is a first logical level;

a second signal inversion circuit having an input terminal connected to a node of second internal write data, a logical level of which is the other logical level which is the same or opposite to said level of write data supplied from the outside, and arranged to be operated when the level of said synchronizing signal is said first logical level;

a third signal inversion circuit having an input terminal connected to an output terminal of said first signal inversion circuit;

a fourth signal inversion circuit having an input terminal connected to an output terminal of said second signal inversion circuit;

a first N-channel transistor having an electric current path formed between the source and the drain thereof and inserted between either of data lines of said data line pair and a node of a first power source potential, and a gate connected to an output terminal of said first signal inversion circuit;

a second N-channel transistor having an electric current path formed between the source and the drain thereof and inserted between the other data line of said data line pair and said node of said first power source potential, and a gate connected to said output terminal of said second signal inversion circuit;

a third P-channel transistor having an electric current path formed between the source and the drain and inserted between a node of said second power source potential and either of data lines of said data line pair, and a gate connected to an output terminal of said fourth signal inversion circuit;

a fourth P-channel transistor having an electric current path formed between the source and the drain thereof and inserted between said node of said second power source potential and the other data line of said data line pair, and a gate connected to an output terminal of said third signal inversion circuit;

a fifth N-channel transistor having an electric current path formed by the source and the drain thereof and inserted between said output terminal of said first signal inversion circuit and said node of said first power source potential and arranged to be controlled in such a manner that said fifth N-channel transistor is electrically conducting when the level of said synchronizing signal is a second logical level; and a sixth N-channel transistor having an electric current path formed between the source and the drain thereof and inserted between said output terminal of said second signal inversion circuit and said node of said first power source potential and arranged to be controlled in such a manner that said sixth N-channel transistor is electrically conducting when the level of said synchronizing signal is said second logical level.

2. A semiconductor memory device according to claim 1, wherein said equalizing circuit sets said data lines to the predetermined potentials in response to a synchronizing signal supplied from outside.

3. A semiconductor memory device according to claim 1, wherein said equalizing circuit, at the time of the equalizing operation, sets said data lines to an intermediate potential of an amplitude of voltage of said data lines when said data lines are operated by said write driver circuit.

4. A semiconductor memory device, comprising:

a memory cell array having a plurality of memory cells to which data can be written;

data lines to which data read from said memory cells and data to be written on said memory cells are transferred said data lines formed by data line pairs for transferring complementary data;

a write driver circuit, the operation of which is controlled in response to a synchronizing signal supplied from outside and which drives said data lines in accordance with write data supplied from the outside; and an equalizing circuit, the operation of which is controlled in response to said synchronizing signal and arranged to set said data lines to predetermined potentials whenever said data lines are driven by said write driver circuit;

wherein said write driver circuit has:

a first N-channel transistor having a gate connected to a node of first internal write data, a logical level of which is the same or opposite to a level of write data supplied from outside, and an electric current path formed between the source and the drain and having an end connected to a first power source potential;

a second N-channel transistor having a gate connected to a node of second internal write data, the logical level of which is the other logical level which is the same or opposite to said level of write data supplied from the outside, and an electric current path formed between the source and the drain and having an end connected to said first power source potential;

a third N-channel transistor having an electric current path formed between the source and the drain thereof and inserted between the other end of said electric current path formed between the source and the drain of said first transistor and either of said data lines of said data line pair and arranged to be controlled in such a manner that said third N-channel transistor is electrically conducting when the level of said synchronizing signal is a first logical level;

a fourth N-channel transistor having an electric current path formed between the source and the drain thereof and inserted between the other end of said electric current path formed between the source and the drain of said second transistor and the other data line of said data line pair and arranged to be controlled in such a manner that said fourth N-channel transistor is electrically conducting when the level of said synchronizing signal is said first logical level;

a first signal inversion circuit having an input terminal connected to said node of first internal write data;

a second signal inversion circuit having an input terminal connected to said node of said second internal write data;

a fifth P-channel transistor having an electric current path formed between the source and the drain thereof and having an end connected to the other data line and arranged to be controlled in such a manner that said fifth P-channel transistor is electrically conducting when the level of said synchronizing signal is said first logical level;

a sixth P-channel transistor having an electric current path formed between the source and the drain and having an end connected to the other data line and arranged to be controlled in such a manner that said sixth P-channel transistor is electrically conducting when the level of said synchronizing signal is said first logical level;

a seventh P-channel transistor having an electric current path formed between the source and the drain thereof and inserted between a node of a second power source potential and another end of said electric current path formed between the source and the drain of said fifth transistor, and a gate connected to said output terminal of said second signal inversion circuit; and an eighth P-channel transistor having an electric current path formed between the source and the drain thereof and inserted between said node of said second power source potential and another end of said electric current path formed between the source and the drain of said sixth transistor, and a gate connected to said output terminal of said first signal inversion circuit.

5. A semiconductor memory device according to claim 4, wherein said write driver circuit and said equalizing circuit are controlled in response to said synchronizing signal such that periods in which said write driver circuit and said equalizing circuit are respectively operated do not overlap.

6. A semiconductor memory device according to claim 4, wherein said equalizing circuit, at the time of the equalizing operation, sets said data lines to an intermediate potential of an amplitude of voltage of said data lines when said data lines are driven by said write driver circuit.

7. A semiconductor memory device, comprising:

a memory cell array having a structure in which a plurality of dynamic memory cells are disposed in a matrix configuration;

bit lines to each of which a plurality of memory cells disposed in one line are commonly connected in said memory cell array;

data lines connected to said bit lines through a column selection switch said data lines comprising data line pairs for transferring complementary data;

an amplifying circuit for reading data connected to said data lines and arranged to amplify the potentials of said data lines:

a first equalizing circuit arranged to be operated in a read mode in which data is read from said memory cells to set said data lines to a predetermined potential prior to reading data from said memory cells;

a write driver circuit connected to said data lines and arranged to drive said data lines in accordance with write data supplied from outside; and a second equalizing circuit arranged to be operated in a write mode in which data is written to said memory cells to set said data lines to a predetermined potential whenever said data lines are driven by said write driver circuit wherein said write driver circuit comprises:

a first signal inversion circuit having an input terminal connected to a node of first internal write data, a logical level of which is the same or opposite to a level of write data supplied from outside, and arranged to be operated when a level of a synchronizing signal is a first logical level;

a second signal inversion circuit having an input terminal connected to a node of second internal write data, a logical level of which is the other logical level which is the same or opposite to said level of write data supplied from the outside, and arranged to be operated when the level of said synchronizing signal is said first logical level;

a first N-channel transistor having an electric current path formed between the source and the drain thereof and inserted between either of data lines of said data line pair and a node of a first power source potential, and a gate connected to an output terminal of said first signal inversion circuit;

a second N-channel transistor having an electric current path formed between the source and the drain thereof and inserted between the other data line of said data line pair and said node of said first power source potential, and a gate connected to said output terminal of said second signal inversion circuit;

a third N-channel transistor having an electric current path formed between the source and the drain and inserted between a node of said second power source potential and either of data lines of said data line pair, and a gate connected to an output terminal of said second signal inversion circuit;

a fourth N-channel transistor having an electric current path formed between the source and the drain thereof and inserted between said node of said second power source potential and the other data line of said data line pair, and a gate connected to an output terminal of said first signal inversion circuit;

a fifth N-channel transistor having an electric current path formed between the source and the drain thereof and inserted between said output terminal of said first signal inversion circuit and said node of said first power source potential and arranged to be controlled in such a manner that said fifth N-channel transistor is electrically conducting when the level of said synchronizing signal is a second logical level; and a sixth N-channel transistor having an electric current path formed between the source and the drain thereof and inserted between said output terminal of said second signal inversion circuit and said node of said first power source potential and arranged to be controlled in such a manner that said sixth N-channel transistor is electrically conducting when the level of said synchronizing signal is said second logical level.

8. A semiconductor memory device according to claim 7, wherein said first and second equalizing circuits respectively set said data lines to said predetermined potential in response to a synchronizing signal supplied from outside.

9. A semiconductor memory device according to claim 7, wherein said second equalizing circuit, at the time of the equalizing operation, sets said data lines to an intermediate potential of an amplitude of voltage of said data lines when said data lines are driven by said write driver circuit.

10. A semiconductor memory device, comprising:

a memory cell array having a plurality of memory cells to which data can be written;

data lines to which data read from said memory cells and data to be written on said memory cells are transferred, said data lines comprising data line pairs for transferring complementary data;

a write driver circuit for driving said data lines in accordance with write data supplied from outside when data is written to said memory cells; and an equalizing circuit for setting said data lines to predetermined potentials whenever said data lines are operated by said write driver circuit, wherein said write driver circuit comprises:

a first signal inversion circuit having an input terminal connected to a node of first internal write data, a logical level of which is the same or opposite to a level of write data supplied from outside, and arranged to be operated when a level of a synchronizing signal is a first logical level;

a second signal inversion circuit having an input terminal connected to a node of second internal write data, a logical level of which is the other logical level which is the same or opposite to said level of write data supplied from the outside, and arranged to be operated when the level of said synchronizing signal is said first logical level;

a first N-channel transistor having an electric current path formed between the source and the drain thereof and inserted between either of data lines of said data line pair and a node of a first power source potential, and a gate connected to an output terminal of said first signal inversion circuit;

a second N-channel transistor having an electric current path formed between the source and the drain thereof and inserted between the other data line of said data line pair and said node of said first power source potential, and a gate connected to said output terminal of said second signal inversion circuit;

a third N-channel transistor having an electric current path formed between the source and the drain and inserted between a node of said second power source potential and either of data lines of said data line pair, and a gate connected to an output terminal of said second signal inversion circuit;

a fourth N-channel transistor having an electric current path formed between the source and the drain thereof and inserted between said node of said second power source potential and the other data line of said data line pair, and a gate connected to an output terminal of said first signal inversion circuit;

a fifth N-channel transistor having an electric current path formed between the source and the drain thereof and inserted between said output terminal of said first signal inversion circuit and said node of said first power source potential and arranged to be controlled in such a manner that said fifth N-channel transistor is electrically conducting when the level of said synchronizing signal is a second logical level; and a sixth N-channel transistor having an electric current path formed between the source and the drain thereof and inserted between said output terminal of said second signal inversion circuit and said node of said first power source potential and arranged to be controlled in such a manner that said sixth N-channel transistor is electrically conducting when the level of said synchronizing signal is said second logical level.

11. A semiconductor memory device, comprising:

a memory cell array having a plurality of memory cells to which data can be written;

data lines to which data read from said memory cells and data to be written on said memory cells are transferred, said data lines comprising data line pairs for transferring complementary data;

a write driver circuit for driving said data lines in accordance with write data supplied from outside when data is written to said memory cells; and an equalizing circuit for setting said data lines to predetermined potentials whenever said data lines are operated by said write driver circuit, wherein said write driver circuit comprises:

a first N-channel transistor having a gate connected to a node of first internal write data, a logical level of which is the same or opposite to a level of write data supplied from outside, and an electric current path formed between the source and the drain and having an end connected to a first power source potential;

a second N-channel transistor having a gate connected to a node of second internal write data, a logical level of which is the other logical level which is the same or opposite to said level of write data supplied from the outside, and an electric current path formed between the source and the drain and having an end connected to said first power source potential;

a third N-channel transistor having an electric current path formed between the source and the drain thereof and inserted between the other end of said electric current path formed between the source and the drain of said first transistor and either of said data lines of said data line pair and arranged to be controlled in such a manner that said third N-channel transistor is electrically conducting when the level of said synchronizing signal is a first logical level;

a fourth N-channel transistor having an electric current path formed between the source and the drain thereof and inserted between the other end of said electric current path formed between the source and the drain of said second transistor and the other data line of said data line pair and arranged to be controlled in such a manner that said fourth N-channel transistor is electrically conducting when the level of said synchronizing signal is said first logical level;

a first signal inversion circuit having an input terminal connected to said node of first internal write data;

a second signal inversion circuit having an input terminal connected to said node of said second internal write data;

a fifth P-channel transistor having an electric current path formed between the source and the drain thereof and having an end connected to the other data line and arranged to be controlled in such a manner that said fifth P-channel transistor is electrically conducting when the level of said synchronizing signal is said first logical level;

a sixth P-channel transistor having an electric current path formed between the source and the drain and having an end connected to the other data line and arranged to be controlled in such a manner that said sixth P-channel transistor is electrically conducting when the level of said synchronizing signal is said first logical level;

a seventh P-channel transistor having an electric current path formed between the source and the drain thereof and inserted between a node of a second power source potential and another end of said electric current path formed between the source and the drain of said fifth transistor, and a gate connected to said output terminal of said second signal inversion circuit; and an eighth P-channel transistor having an electric current path formed between the source and the drain thereof and inserted between said node of said second power source potential and another end of said electric current path formed between the source and the drain of said sixth transistor, and a gate connected to said output terminal of said first signal inversion circuit.

12. A semiconductor memory device, comprising:

a memory cell array having a structure in which a plurality of dynamic memory cells are disposed in a matrix configuration;

bit lines to each of which a plurality of memory cells disposed in one line are commonly connected in said memory cell array;

data lines connected to said bit lines through a column selection switch, said data lines comprising data line pairs for transferring complementary data;

an amplifying circuit for reading data connected to said data lines and arranged to amplify the potentials of said data lines;

a first equalizing circuit arranged to be operated in a read mode in which data is read from said memory cells to set said data lines to a predetermined potential prior to reading data from said memory cells;

a write driver circuit connected to said data lines and arranged to drive said data lines in accordance with write data supplied from outside: and a second equalizing circuit arranged to be operated in a write mode in which data is written to said memory cells to set said data lines to a predetermined potential whenever said data lines are driven by said write driver circuit wherein said write driver circuit comprises:

a first signal inversion circuit having an input terminal connected to a node of first internal write data, a logical level of which is the same or opposite to a level of write data supplied from outside, and arranged to be operated when a level of a synchronizing signal is a first logical level;

a second signal inversion circuit having an input terminal connected to a node of second internal write data, a logical level of which is the other logical level which is the same or opposite to said level of write data supplied from the outside, and arranged to be operated when the level of said synchronizing signal is said first logical level;

a third signal inversion circuit having an input terminal connected to an output terminal of said first signal inversion circuit;

a fourth signal inversion circuit having an input terminal connected to an output terminal of said second signal inversion circuit;

a first N-channel transistor having an electric current path formed between the source and the drain thereof and inserted between either of data lines of said data line pair and a node of a first power source potential, and a gate connected to an output terminal of said first signal inversion circuit;

a second N-channel transistor having an electric current path formed between the source and the drain thereof and inserted between the other data line of said data line pair and said node of said first power source potential, and a gate connected to said output terminal of said second signal inversion circuit;

a third P-channel transistor having an electric current path formed between the source and the drain and inserted between a node of said second power source potential and either of data lines of said data line pair, and a gate connected to an output terminal of said fourth signal inversion circuit;

a fourth P-channel transistor having an electric current path formed between the source and the drain thereof and inserted between said node of said second power source potential and the other data line of said data line pair, and a gate connected to an output terminal of said third signal inversion circuit;

a fifth N-channel transistor having an electric current path formed between the source and the drain thereof and inserted between said output terminal of said first signal inversion circuit and said node of said first power source potential and arranged to be controlled in such a manner that said fifth N-channel transistor is electrically conducting when the level of said synchronizing signal is a second logical level; and a sixth N-channel transistor having an electric current path formed between the source and the drain thereof and inserted between said output terminal of said second signal inversion circuit and said node of said first power source potential and arranged to be controlled in such a manner that said sixth N-channel transistor is electrically conducting when the level of said synchronizing signal is said second logical level.

13. A semiconductor memory device, comprising:

a memory cell array having a structure in which a plurality of dynamic memory cells are disposed in a matrix configuration;

bit lines to each of which a plurality of memory cells disposed in one line are commonly connected in said memory cell array;

data lines connected to said bit lines through a column selection switch said data lines comprising data line pairs for transferring complementary data;

an amplifying circuit for reading data connected to said data lines and arranged to amplify the potentials of said data lines;

a first equalizing circuit arranged to be operated in a read mode in which data is read from said memory cells to set said data lines to a predetermined potential prior to reading data from said memory cells;

a write driver circuit connected to said data lines and arranged to drive said data lines in accordance with write data supplied from outside; and a second equalizing circuit arranged to be operated in a write mode in which data is written to said memory cells to set said data lines to a predetermined potential whenever said data lines are driven by said write driver circuit wherein said write driver circuit comprises:

a first N-channel transistor having a gate connected to a node of first internal write data, a logical level of which is the same or opposite to a level of write data supplied from outside, and an electric current path formed between the source and the drain and having an end connected to a first power source potential;

a second N-channel transistor having a gate connected to a node of second internal write data, the logical level of which is the other logical level which is the same or opposite to said level of write data supplied from the outside, and an electric current path formed between the source and the drain and having an end connected to said first power source potential;

a third N-channel transistor having an electric current path formed between the source and the drain thereof and inserted between the other end of said electric current path formed between the source and the drain of said first transistor and either of said data lines of said data line pair and arranged to be controlled in such a manner that said third N-channel transistor is electrically conducting when the level of said synchronizing signal is a first logical level;

a fourth N-channel transistor having an electric current path formed between the source and the drain thereof and inserted between the other end of said electric current path formed between the source and the drain of said second transistor and the other data line of said data line pair and arranged to be controlled in such a manner that said fourth N-channel transistor is electrically conducting when the level of said synchronizing signal is said first logical level;

a first signal inversion circuit having an input terminal connected to said node of first internal write data;

a second signal inversion circuit having an input terminal connected to said node of said second internal write data;

a fifth P-channel transistor having an electric current path formed between the source and the drain thereof and having an end connected to the other data line and arranged to be controlled in such a manner that said fifth P-channel transistor is electrically conducting when the level of said synchronizing signal is said first logical level;

a sixth P-channel transistor having an electric current path formed between the source and the drain and having an end connected to the other data line and arranged to be controlled in such a manner that said sixth P-channel transistor is electrically conducting when the level of said synchronizing signal is said first logical level;

a seventh P-channel transistor having an electric current path formed between the source and the drain thereof and inserted between a node of a second power source potential and another end of said electric current path formed between the source and the drain of said fifth transistor, and a gate connected to said output terminal of said second signal inversion circuit; and an eighth P-channel transistor having an electric current path formed between the source and the drain thereof and inserted between said ode of said second power source potential and another end of said electric current path formed between the source and the drain of said sixth transistor, and a gate connected to said output terminal of said first signal inversion circuit.

14. A semiconductor memory device, comprising:

a memory cell array having a plurality of memory cells to which data can be written;

data lines to which data read from said memory cells and data to be written on said memory cells are transferred, said data lines formed by data line pairs for transferring complementary data;

a write driver circuit, the operation of which is controlled in response to a synchronizing signal supplied from outside and which drives said data lines in accordance with write data supplied from the outside; and an equalizing circuit, the operation of which is controlled in response to said synchronizing signal and arranged to set said data lines to predetermined potentials whenever said data lines are driven by said write driver circuit;

wherein said write driver circuit has:

a first signal inversion circuit having an input terminal connected to a node of first internal write data, a logical level of which is the same or opposite to a level of write data supplied from outside, and arranged to be operated when a level of a synchronizing signal is a first logical level;

a second signal inversion circuit having an input terminal connected to a node of second internal write data, a logical level of which is the other logical level which is the same or opposite to said level of write data supplied from the outside, and arranged to be operated when the level of said synchronizing signal is said first logical level;

a third signal inversion circuit having an input terminal connected to an output terminal of said first signal inversion circuit;

a fourth signal inversion circuit having an input terminal connected to an output terminal of said second signal inversion circuit;

a first N-channel transistor having an electric current path formed between the source and the drain thereof and inserted between either of data lines of said data line pair and a node of a first power source potential, and a gate connected to an output terminal of said first signal inversion circuit;

a second N-channel transistor having an electric current path formed between the source and the drain thereof and inserted between the other data line of said data line pair and said node of said first power source potential, and a gate connected to said output terminal of said second signal inversion circuit;

a third P-channel transistor having an electric current path formed between the source and the drain and inserted between a node of said second power source potential and either of data lines of said data line pair, and a gate connected to an output terminal of said fourth signal inversion circuit;

a fourth P-channel transistor having an electric current path formed between the source and the drain thereof and inserted between said node of said second power source potential and the other data line of said data line pair, and a gate connected to an output terminal of said third signal inversion circuit; and a fifth N-channel transistor having an electric current path formed by the source and the drain thereof and inserted between said output terminal of said first signal inversion circuit and said node of said first power source potential and arranged to be controlled in such a manner that said fifth N-channel transistor is electrically conducting when the level of said synchronizing signal is a second logical level; and a sixth N-channel transistor having an electric current path formed between the source and the drain thereof and inserted between said output terminal of said second signal inversion circuit and said node of said first power source potential and arranged to be controlled in such a manner that said sixth N-channel transistor is electrically conducting when the level of said synchronizing signal is said second logical level.

15. A semiconductor memory device, comprising:

a memory cell array having a plurality of memory cells to which data can be written;

data lines to which data read from said memory cells and data to be written on said memory cells are transferred, said data lines formed by data line pairs for transferring complementary data;

a write driver circuit, the operation of which is controlled in response to a synchronizing signal supplied from outside and which drives said data lines in accordance with write data supplied from the outside; and an equalizing circuit, the operation of which is controlled in response to said synchronizing signal and arranged to set said data lines to predetermined potentials whenever said data lines are driven by said write driver circuit;

wherein said write driver circuit has;

a first signal inversion circuit having an input terminal connected to a node of first internal write data, a logical level of which is the same or opposite to a level of write data supplied from outside, and arranged to be operated when a level of a synchronizing signal is a first logical level;

a second signal inversion circuit having an input terminal connected to a node of second internal write data, a logical level of which is the other logical level which is the same or opposite to said level of write data supplied from the outside, and arranged to be operated when the level of said synchronizing signal is said first logical level;

a first N-channel transistor having an electric current path formed between the source and the drain thereof and inserted between either of data lines of said data line pair and a node of a first power source potential, and a gate connected to an output terminal of said first signal inversion circuit;

a second N-channel transistor having an electric current path formed between the source and the drain thereof and inserted between the other data line of said data line pair and said node of said first power source potential, and a gate connected to said output terminal of said second signal inversion circuit;

a third N-channel transistor having an electric current path formed between the source and the drain and inserted between a node of said second power source potential and either of data lines of said data line pair, and a gate connected to an output terminal of said second signal inversion circuit;

a fourth N-channel transistor having an electric current path formed between the source and the drain thereof and inserted between said node of said second power source potential and the other data line of said data line pair, and a gate connected to an output terminal of said first signal inversion circuit;

a fifth N-channel transistor having an electric current path formed between the source and the drain thereof and inserted between said output terminal of said first signal inversion circuit and said node of said first power source potential and arranged to be controlled in such a manner that said fifth N-channel transistor is electrically conducting when the level of said synchronizing signal is a second logical level; and a sixth N-channel transistor having an electric current path formed between the source and the drain thereof and inserted between said output terminal of said second signal inversion circuit and said node of said first power source potential and arranged to be controlled in such a manner that said sixth N-channel transistor is electrically conducting when the level of said synchronizing signal is said second logical level.

* * * * *